United States Patent
Lee

(10) Patent No.: US 9,814,132 B2
(45) Date of Patent: Nov. 7, 2017

(54) DISPLAY DEVICE

(71) Applicant: SAMSUNG DISPLAY CO., LTD., Yongin, Gyeonggi-Do (KR)

(72) Inventor: Hee-Kwon Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 276 days.

(21) Appl. No.: 14/301,975

(22) Filed: Jun. 11, 2014

(65) Prior Publication Data

US 2015/0173176 A1 Jun. 18, 2015

(30) Foreign Application Priority Data

Dec. 17, 2013 (KR) ........................ 10-2013-0156949

(51) Int. Cl.
| | |
|---|---|
| *H05K 1/02* | (2006.01) |
| *H05K 9/00* | (2006.01) |
| *H01L 51/52* | (2006.01) |
| *H05K 1/18* | (2006.01) |

(52) U.S. Cl.
CPC ....... *H05K 1/0259* (2013.01); *H01L 51/5237* (2013.01); *H05K 9/0096* (2013.01); *H05K 1/189* (2013.01); *H05K 2201/10128* (2013.01)

(58) Field of Classification Search
CPC .......... H05K 1/02; H05K 9/00; H05K 1/0259; H05K 9/0079; H05K 1/028; H05K 2201/10128
USPC ........................................................ 361/749
See application file for complete search history.

(56) References Cited

U.S. PATENT DOCUMENTS

| | | | | |
|---|---|---|---|---|
| 2005/0170565 | A1* | 8/2005 | Fujii | ................. H01L 27/12 438/149 |
| 2007/0171215 | A1* | 7/2007 | Song | ................. G02B 6/0083 345/204 |
| 2011/0291683 | A1 | 12/2011 | Mueller | |
| 2012/0327328 | A1* | 12/2012 | Kim | ............ G02F 1/133308 349/59 |
| 2013/0169558 | A1* | 7/2013 | Min | ................. G06F 3/044 345/173 |

FOREIGN PATENT DOCUMENTS

| | | |
|---|---|---|
| KR | 20-0371070 Y1 | 12/2004 |
| KR | 10-2005-0076458 A | 7/2005 |
| KR | 10-2013-0001068 A | 1/2013 |

OTHER PUBLICATIONS

English abstract, Application No. 2020040026613, dated Sep. 16, 2004, for corresponding Korean No. 20-0371070 Y1 listed above, 2 pages.

* cited by examiner

*Primary Examiner* — Eric Thomas
*Assistant Examiner* — Michael P McFadden
(74) *Attorney, Agent, or Firm* — Lewis Roca Rothgerber Christie LLP

(57) ABSTRACT

A display device having a display panel, a conductive shielding film disposed on a surface of the display panel, and a flexible circuit unit connected to another surface of the display panel and configured to provide a driving signal to the display panel, wherein the shielding film has at least one protrusion disposed adjacent the flexible circuit unit.

7 Claims, 6 Drawing Sheets

DISPLAY DEVICE

CROSS-REFERENCE TO RELATED APPLICATION

This application claims priority to and the benefit of Korean Patent Application No. 10-2013-0156949, filed on Dec. 17, 2013, with the Korean Intellectual Property Office, the disclosure of which is incorporated herein in its entirety by reference.

BACKGROUND

1. Field

Embodiments of the present invention relate to a display device, and in particular, to a display device having a protrusion adjacent to a flexible circuit unit, thereby preventing electrostatic damage.

2. Description of the Related Art

Recently, display devices have become thinner and have higher definition.

However, as a display device becomes thinner, static electricity is easily accumulated inside the display device by electric shock or friction from outside, and when static electricity is discharged, internal circuits or elements of the display device are affected by the electrostatic discharge (ESD).

For display devices with high definition, circuits and elements are highly integrated, and thus static electricity is easily generated in the display device.

Static electricity is electric charge accumulated in an electric element, etc., by friction or electric shock, and has a high discharging voltage which shocks the electric device comprising the electric element. That is, because the discharging voltage of electrostatic discharge of the static electricity is sometimes up to a thousand or tens of thousands volts, elements or connecting units between the elements of the electric device are damaged or a temperature of the elements increases, and so, the static electricity may be a cause of a defect in the electric device.

Therefore, in order to protect inner elements of the display device which is thin and highly integrated, it is very important to effectively eliminate the static electricity accumulated in the display device.

SUMMARY

Aspects of embodiments of the present disclosure are directed to a display device comprising a shielding film for shielding electrostatic discharge.

In addition, aspects of embodiments of the present disclosure are directed to a display device that can easily remove static electricity generated in a vicinity of a driving chip of a COF (Chip On Film).

In addition, aspects of embodiments of the present disclosure are directed to a display device that can easily remove static electricity through a conductive protrusion.

An embodiment of the present disclosure provides a display device comprising a display panel; a conductive shielding film disposed on a surface of the display panel; and a flexible circuit unit connected to another surface of the display panel and providing a driving signal to the display panel, wherein the shielding film has at least one protrusion disposed adjacent to the flexible circuit unit.

The flexible circuit unit may comprise a driving PCB (Printed Circuit Board) and a COF connected to the driving PCB.

A driving chip may be disposed on the COF.

The COF may be folded according to a side of the display panel, and the driving PCB may face a surface of the shielding film.

The shielding film may comprise a metal layer including at least one selected from the group consisting of copper (Cu), aluminum (Al), silver (Ag) and gold (Au).

The shielding film may comprise an insulation layer disposed on at least a part of the metal layer, and the driving chip may face the insulation layer.

The shielding film may further comprise a graphite layer on the metal layer.

A connector may be further provided to connect the protrusion to a ground.

The connector may be a soldering or a conductive sheet.

The ground may be formed on at least one of a substrate, a touch panel and a window.

Another embodiment of the present disclosure provides a display device comprising a substrate; a flexible circuit unit connected to a surface of the substrate and providing a driving signal to the substrate; and a conductive line disposed on an edge of the substrate; wherein the substrate comprises at least one conductive pattern which is adjacent to the flexible circuit unit and connected to the conductive line.

The substrate may comprise a substrate protrusion and the conductive pattern may be formed on the substrate protrusion.

According to an embodiment of the present disclosure, because a display device comprises a protrusion adjacent to a flexible circuit unit, static electricity generated in the display device or introduced into an inside of the display device from the outside is easily removed. In particular, according to an embodiment of the present disclosure, static electricity generated adjacent to a COF connecting a display panel and a driving PCB, which provides the display panel with a driving signal and driving power, etc., is easily removed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present invention will be more clearly understood from the following detailed description taken in conjunction with the accompanying drawings, in which.

DETAILED DESCRIPTION

Figure 1:
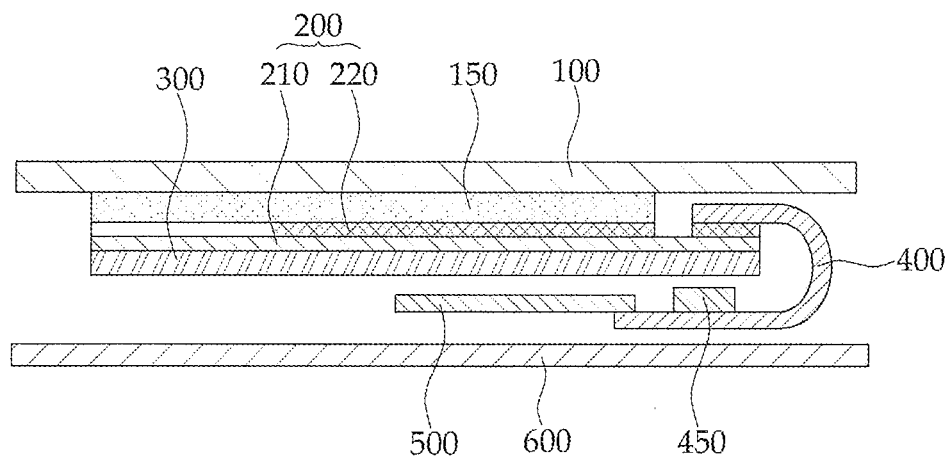
FIG. 1 is a schematic cross-sectional view of an organic light emitting display device.

Hereinafter, embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, certain elements or shapes may be simplified or exaggerated to better illustrate the present invention, and some elements present in an actual product may also be omitted. Like reference numerals refer to like elements throughout the specification. That is, even when elements in different drawings are designated as a same numeral, they may not be the same in shape. Thus, the drawings are intended to facilitate the understanding of the present invention.

In addition, when a layer or element is referred to as being "on" another layer or element, the layer or element may be directly on the other layer or element, or one or more intervening layers or elements may be interposed therebetween.

Hereinafter, an embodiment will be described in detail with reference to an organic light emitting display device of FIG. 1, as an example of a display device.

The organic light emitting display device is drawing attention because of its advantages such as low energy consumption, high brightness and short response time.

Referring to FIG. 1, the organic light emitting display device according to an embodiment comprises a display panel 200 for displaying an image, a flexible circuit unit connected to the display panel 200 and providing a driving signal to the display panel 200, and a shielding film 300 disposed on a non-displaying surface of the display panel 200 and having conductivity. Here, the flexible circuit unit comprises a driving PCB (Printed Circuit Board) 500 providing the driving signal to the display panel 200 and a COF (Chip On Flexible Printed Circuit or Chip On Film) 400 connecting the display panel 200 to the driving PCB 500.

Figure 2:
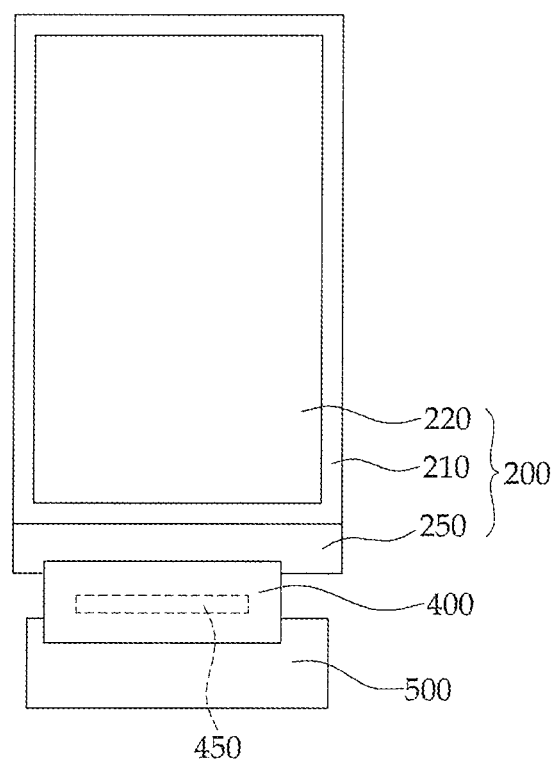
FIG. 2 is a plan view of an organic light emitting panel provided with a COF and a driving PCB.

FIG. 2 is a plan view of an organic light emitting panel including a COF 400 and a driving PCB 500.

FIG. 2 illustrates an unfolded state of the display panel (e.g. organic light emitting panel) 200, that is a display panel, a COF 400 and a driving PCB 500, which are connected each other.

The display panel 200 comprises a substrate 210 and a displaying unit 220 disposed on the substrate 210.

The substrate 210 is made of an insulation material such as glass, quartz, ceramic or plastic. In a flexible display device, a plastic substrate may be used. The displaying unit 220 is disposed on the substrate 210. The displaying unit 220 comprises an organic light emitting diode (OLED) as a displaying element to display an image.

Although not illustrated in detail, a plurality of gate lines, data lines, power supplying lines, etc., are formed on the substrate 210, and a pixel can be defined by intersecting the gate line with the data line. In addition, the pixel may also be defined by a black matrix or a pixel defining layer.

The pixel may comprise a switching thin film transistor (TFT), a driving thin film transistor (TFT), a capacitor and an organic light emitting diode (OLED). The switching TFT may serve as a switching element that selects a pixel to emit light. The driving TFT applies a driving power source for emitting light from an organic light emitting layer of the OLED within the selected pixel to a pixel electrode. The capacitor stores charges corresponding to a data voltage, a current corresponding to the above stored charges flows to the OLED through the driving TFT and emits light from the OLED.

The OLED includes a hole injection electrode, the organic light emitting layer, and an electron injection electrode. A hole is injected from the hole injection electrode, and an electron is injected from the electron injection electrode. The injected hole and electron are coupled to each other in the organic light emitting layer so as to form an exciton, and light is emitted by energy generated when the exciton falls from an excited state to a ground state. The hole injection electrode may be the pixel electrode, or the electron injection electrode may be the pixel electrode.

FIG. 1 exemplifies a top emission type organic light emitting display device that displays images through a window 100 opposite of the substrate 210. Here, a surface that displays images or that is positioned in a direction towards the window 100, is referred to as a front surface, and a surface that does not display an image or that is positioned in a direction toward the bottom case 600 is referred to as a rear surface.

The driving PCB 500 of the flexible circuit unit which provides a driving signal to the display panel 200 is disposed at a side of the display panel 200, and the driving PCB 500 is electrically connected to the display panel 200 through the COF 400.

The COF 400 is electrically connected to the display panel 200 through a pad unit 250 disposed on the substrate 210. A plurality of signal input lines that send a driving power source and driving signals from the driving PCB 500 into the display panel 200 are disposed on the pad unit 250. Each of the signal input lines disposed on the pad unit 250 are connected to an element within the display panel 200. In addition, a driving chip 450 is mounted on a surface of the COF 400.

The driving PCB 500 is mounted on the rear surface of the display panel 200 through the COF 400 which is made of a flexible material. That is, the flexible COF 400 is folded toward the rear surface of the display panel 200, and thereby the driving PCB 500 can be disposed on the rear surface of the display panel 200.

The COF 400 comprises a base member made of a flexible material and the driving chip and the signal input lines are formed on the base member. The COF 400 may further include a TCP (Tape Carrier Package).

An encapsulation layer 150 is disposed on the display panel 200 to protect the OLED, and the window 100 is disposed on the encapsulation layer 150. A protection member such as the bottom case 600 is disposed on the opposite side of the window 100.

The window 100 may be formed of glass, quartz, ceramic or plastic, etc., and a flexible plastic window may be used in a flexible display device. The window 100 is not always provided to the display device, and may be omitted in some embodiments.

The encapsulation layer 150 protects the OLED of the display panel 200 from air, water, oxygen, etc., and is made of a transparent organic material or inorganic material having a waterproof property. The encapsulation layer 150 may be made by mixing an organic material with an inorganic material, and may have a structure where an organic layer and an inorganic layer are alternately laminated.

The bottom case 600 serves to protect the display panel 200, and is not always provided for the display device, and may be omitted in some embodiments.

Figure 3:
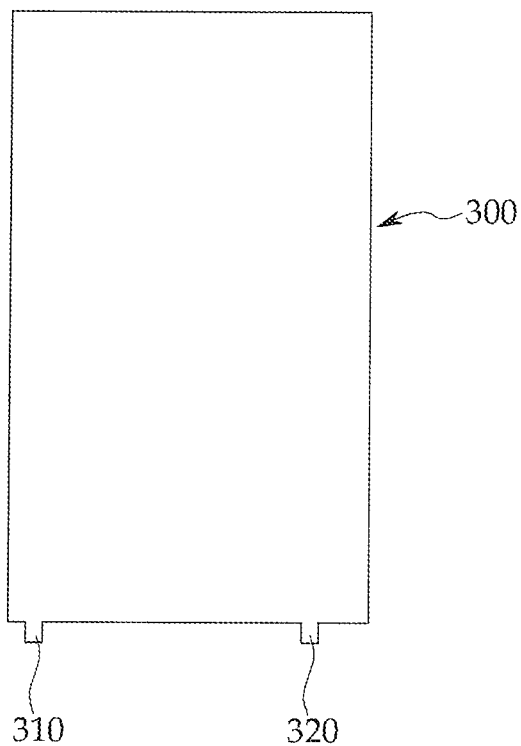
FIG. 3 is a plan view of a shielding film according to an embodiment.

An example of a shielding film 300 serving as an electrostatic shielding layer is described in FIG. 3.

The shielding film 300 is disposed on the rear surface of the display panel 200, which is a non-displaying surface, and has conductivity. The shielding film 300 may be adhered to the rear surface of the substrate 210 of the display panel 200 through an adhesive.

The shielding film 300 may comprise a metal layer including a metal such as copper (Cu), aluminum (Al), silver (Ag) and gold (Au), etc., or a metal alloy.

The shielding film 300 may have a multi-layered structure, for example, the shielding film 300 may have at least one graphite layer and at least one metal layer.

The shielding film 300 includes conductive protrusions 310 and 320.

The shielding film 300 may be fabricated integrally with the protrusions 310 and 320. In addition, the shielding film 300 may be fabricated by attaching protrusions 310 and 320 onto a flat film.

The protrusions 310 and 320 may be made of metal such as copper (Cu), aluminum (Al), silver (Ag) and gold (Au), a metal alloy or other conductive materials.

Size of the protrusions 310 and 320 varies depending on the size of the display device or the size of an inner space of the display device. For example, the size of the protrusions 310 and 320 may be about 2 mm to about 10 mm in width and about 2 mm to about 10 mm in length. However, the size of the protrusions 310 and 320 is not limited thereto.

The shielding film 300 may be configured as a conductive heat dissipation sheet having a protrusion to perform electrostatic shielding and heat dissipation.

Figure 4:
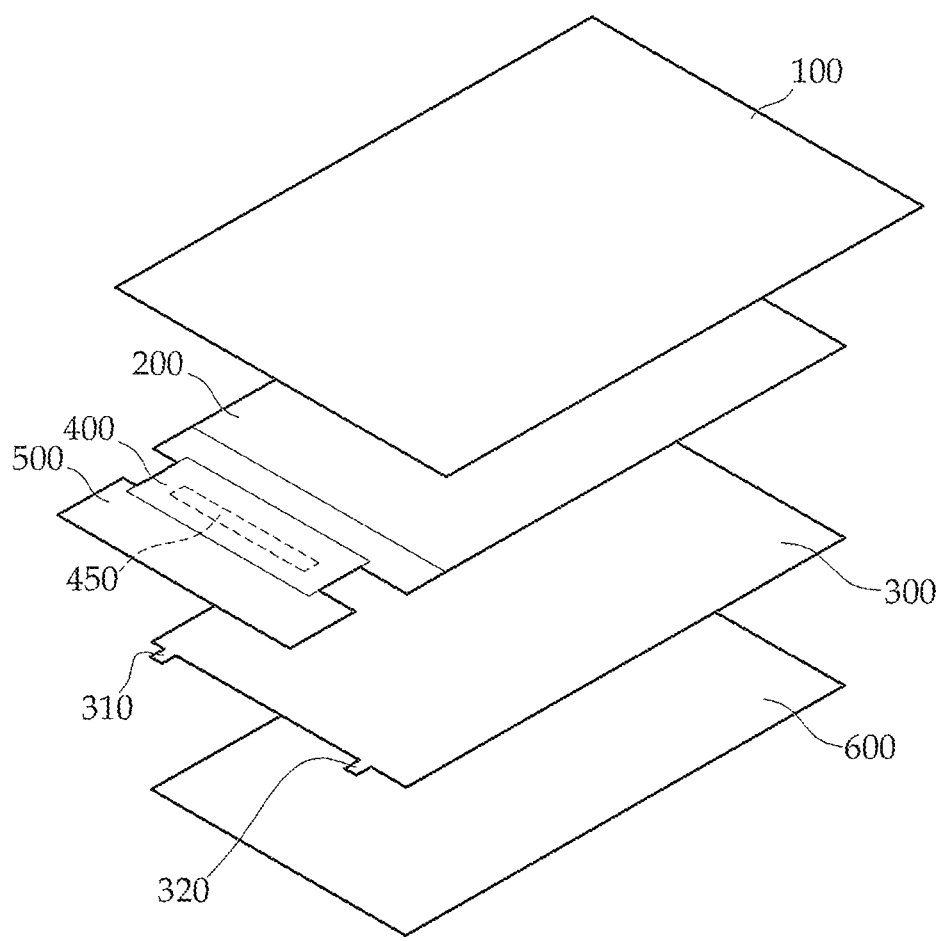
FIG. 4 is an exploded perspective view of an organic light emitting display device according to an embodiment.

FIG. 4 is an exploded perspective view of an organic light emitting display device according to an embodiment. Referring to FIG. 4, one end of the COF 400 is connected to the display panel 200 and the other end of the COF 400 is connected to the driving PCB 500. In an assembly of a display device, the COF 400 is folded from the front surface of the display panel 200 onto the shielding film 300 disposed on the rear surface of the display panel 200, and thereby the driving PCB 500 faces the shielding film 300. As a result the shielding film 300 is disposed between the display panel 200 and the driving PCB 500.

Figure 5A:
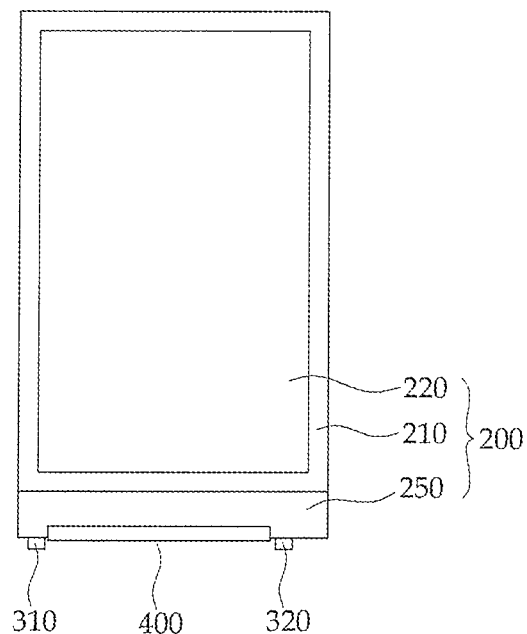
FIG. 5a is a front view of a display device in which a COF and a driving PCB are mounted on a rear surface of a display panel.
Figure 5B:
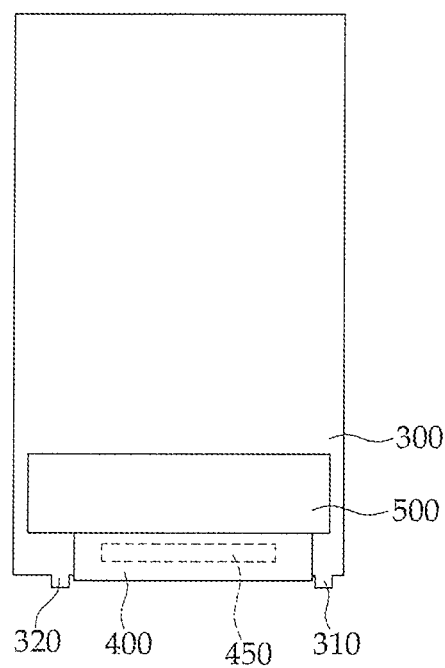
FIG. 5b is a rear view of a display device in which a COF and a driving PCB are mounted on a rear surface of a display panel.

FIG. 5a is a front view of a display device in which a COF and a driving PCB are mounted on the rear surface of a display panel 200. FIG. 5b is a rear view of a display device in which a COF 400 and a driving PCB 500 are mounted on the rear surface of a display panel. Referring to FIGS. 4, 5a and 5b, protrusions 310 and 320 are disposed adjacent to an area where the COF 400 is folded.

In this embodiment, the protrusions 310 and 320, which are disposed under the display panel 200 and protrude outside, serve as antennas to induce static electricity, and thereby prevent static electricity from being accumulated under the display panel 200 in a vicinity of a connecting part between the display panel 200 and the COF 400.

As illustrated in FIG. 2, the COF may be disposed to a side of the display panel 200. Under this circumstance, when the COF 400 is folded and mounted through a process of assembly, static electricity may be generated or charged in an area between the left side and the lower side of the display panel 200 with relatively high possibility because a lot of electronic components are disposed between a left side and a lower side of the display panel 200 by folding the COF. Furthermore, as the display device becomes thinner and higher definition, elements and lines are more integrated, and a possibility of electrostatic generation becomes higher. In particular, when a lot of signal input lines pass the vicinity of the driving chip 450 of the COF, the possibility of generation of an electrostatic discharge near the driving chip 450 of the COF is high.

The protrusions 310, 320 of the shielding film 300 are disposed near the driving chip 450 of the COF 400 as illustrated in FIGS. 5a and 5b, and therefore, accumulation of static electricity near the driving chip 450 of the COF 400 is effectively prevented and electrostatic discharge with high voltage is also prevented.

In addition, the two protrusions 310 and 320 are both positioned outside of the folded portion of the COF 400, and thus an electrostatic shield can effectively be accomplished by the shielding film 300.

Figure 6:
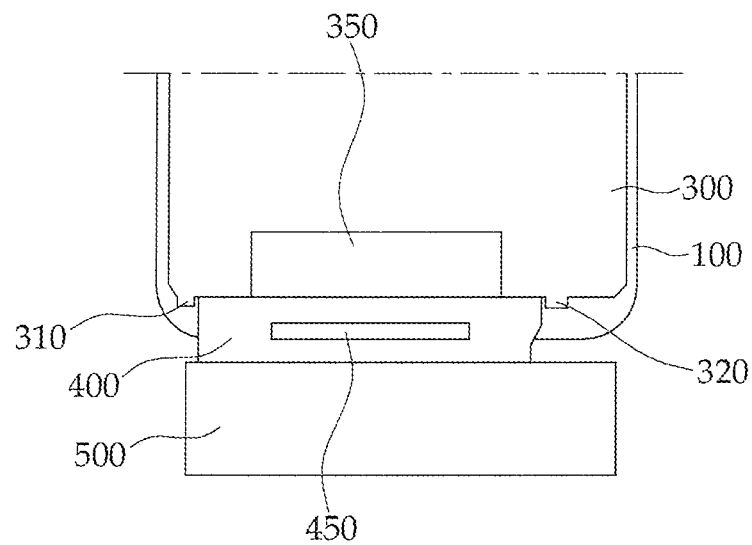
FIG. 6 is an expanded partial rear view illustrating a positional relationship between a shielding film and a COF according to an embodiment.

FIG. 6 is an expanded partial rear view illustrating a positional relationship between a shielding film 300 and a COF 400 according to an embodiment.

The shielding film 300 comprises metal layer and an insulation layer 350 disposed on at least a surface of the metal layer. The insulation layer 350 is disposed on at least an area corresponding to the driving chip 450 of COF 400. That is, the insulation layer 350 is disposed on an area of the shielding film 300 corresponding to a position where the driving chip 450 is to be placed when the COF 400 is folded toward the shielding film 300. In addition, in order to effectively prevent the driving chip 450 from electrically connecting to the shielding film 300, the insulation layer 350 may be disposed on the entire surface of the shielding film 300.

In addition, the protrusions 310 and 320 of the shielding film 300 may connect to at least one ground provided in the display device. In this embodiment, static electricity of the display device can easily be removed.

Figure 7:
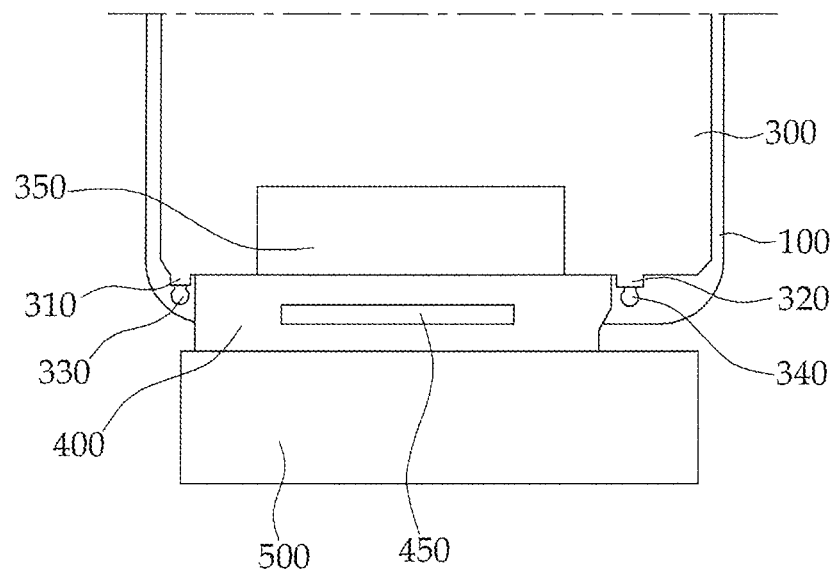
FIG. 7 is an expanded partial rear view illustrating a positional relationship between a shielding film and a COF according to another embodiment.

FIG. 7 is an expanded partial rear view illustrating a positional relationship between a shielding film 300 and a COF 400 according to another embodiment. The shielding film 300 of FIG. 7 further comprises connectors 330 and 340 connected to the protrusions 310 and 320. The connectors 330 and 340 electrically connect the protrusions 310 and 320 of the shielding film 300 to at least one ground provided in the display device. Referring to FIG. 7, connectors 330 and 340 are formed of by soldering. In addition, connectors 330 and 340 may be formed of a conductive sheet.

The ground connected to the protrusions 310 and 320 may be formed on, for example, a substrate, a touch panel or a window, and may be formed on another part of the display device.

Figure 8:
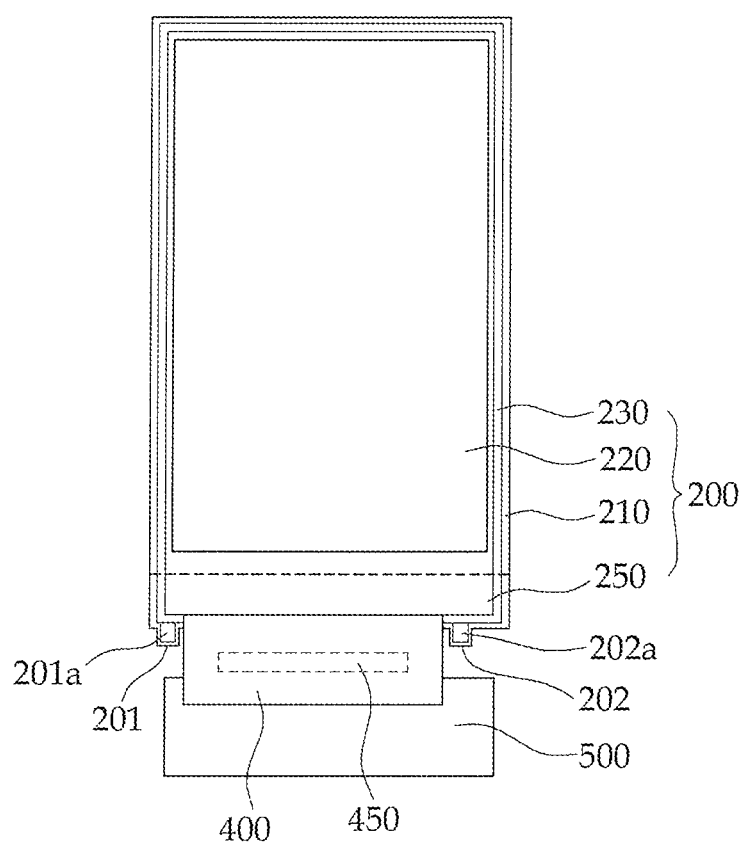
FIG. 8 is a front view illustrating a positional relationship between an organic light emitting panel and a COF according to another further embodiment.

FIG. 8 is a front view illustrating a positional relationship between a display panel (e.g., organic light emitting panel) 200 and a COF 400 according to another embodiment. Referring to FIG. 8, a conductive line 230 is disposed along an edge of the substrate 210 apart from the displaying unit 220. As an example, the conductive line 230 can be a substrate ground or a substrate protecting line. In addition, conductive patterns 201a and 202a are formed on the substrate 210. The conductive patterns 201a and 202a may be formed together with the conductive line 230.

Referring to FIG. 8, substrate 210 of the display panel 200 further comprises substrate protrusions 201 and 202. In addition, conductive patterns 201a and 202a are formed on the substrate protrusions of 201 and 202. The conductive patterns 201a and 202a may be formed together with the conductive line 230.

In addition, the substrate protrusions 201 and 202 are disposed in a vicinity of the driving chip 450 of the COF 400. For example, the COF 400 is preferably disposed between the substrate protrusions 201 and 202 or the conductive patterns 201a and 202a.

With this structure, static electricity is induced to the conductive patterns 201a and 202a of the substrate 210, the induced static electricity is spread to the substrate 210 through the conductive line 230, which can prevent static electricity from affecting the driving circuits.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims, and equivalents thereof.

What is claimed is:

1. A display device comprising:
a substrate;
a flexible circuit unit connected to a surface of the substrate and configured to provide a driving signal to the substrate; and
a conductive line along an edge of the substrate,
wherein the substrate comprises at least one conductive pattern adjacent to the flexible circuit unit and connected to the conductive line,
the conductive pattern is electrically isolated from the flexible circuit unit, and
the conductive line is a substrate ground or a substrate protecting line.

2. The display device of claim 1, wherein the substrate comprises a substrate protrusion, and the at least one conductive pattern is disposed on the substrate protrusion.

3. The display device of claim 1, wherein the flexible circuit unit comprises a driving PCB (Printed Circuit Board) configured to provide a driving signal and a COF (Chip on Film) connected to the driving PCB.

4. The display device of claim 3, wherein the COF is folded along a side of the substrate, and the driving PCB faces a surface of the substrate.

5. The display device of claim 2, further comprising a connector configured to connect the substrate protrusion to a ground.

6. The display device of claim 5, wherein the connector is a soldering or a conductive sheet.

7. The display device of claim 6, wherein the ground is formed on at least one of a substrate, a touch panel, and a window.

* * * * *